United States Patent [19]

Takaishi et al.

[11] Patent Number: 6,146,467
[45] Date of Patent: Nov. 14, 2000

[54] TREATMENT METHOD FOR SEMICONDUCTOR SUBSTRATES

[75] Inventors: Kazushige Takaishi; Ryoko Takada, both of Tokyo, Japan

[73] Assignees: Mitsubishi Materials Silicon Corporation; Mitsubishi Materialc Corporation, both of Tokyo, Japan

[21] Appl. No.: 09/384,143

[22] Filed: Aug. 27, 1999

[30] Foreign Application Priority Data

Aug. 28, 1998 [JP] Japan .................................. 10-243008

[51] Int. Cl.[7] ...................................................... C23G 1/02
[52] U.S. Cl. .................. 134/3; 134/2; 134/25.4; 134/26; 134/28; 134/29; 134/34; 134/36; 134/39; 134/40; 134/41; 134/902; 510/175; 510/176; 510/367; 510/477
[58] Field of Search .................... 134/2, 3, 25.4, 134/26, 28, 29, 34, 36, 39, 40, 41, 902; 510/175, 176, 367, 497

[56] References Cited

U.S. PATENT DOCUMENTS

| | | | |
|---|---|---|---|
| 5,470,393 | 11/1995 | Fukazawa | 134/26 |
| 5,637,151 | 6/1997 | Schulz | 134/26 |
| 5,679,171 | 10/1997 | Saga et al. | 134/26 |
| 5,810,940 | 9/1998 | Fukazawa et al. | 134/28 |
| 5,932,022 | 8/1999 | Linn et al. | 134/3 |
| 5,938,857 | 8/1999 | Fujiwara et al. | 134/25.4 |

FOREIGN PATENT DOCUMENTS

0982765A2 3/2000 European Pat. Off. .

*Primary Examiner*—Sharidan Carrillo
*Attorney, Agent, or Firm*—Reed Smith Shaw & McClay LLP

[57] ABSTRACT

A method of treating a semiconductor substrate by first oxidizing and reducing the semiconductor substrate by immersion in an aqueous solution of ammonium hydroxide and hydrogen peroxide, and then oxidizing the semiconductor substrate by immersion in an aqueous solution of ozone, nitric acid, hydrogen peroxide, or mixtures thereof, and then reducing the oxidized semiconductor substrate by immersing it in a first aqueous solution composed of a mixture of hydrofluoric acid and an organic acid or salt thereof, thereafter rinsing the reduced semiconductor substrate by immersion in a second aqueous solution composed of a mixture of hydrofluoric acid and an organic acid or salt thereof, and then reoxidizing the rinsed semiconductor substrate by immersing it in an aqueous solution of ozone, nitric acid, hydrogen peroxide or mixtures thereof.

5 Claims, 2 Drawing Sheets

TREATMENT METHOD FOR SEMICONDUCTOR SUBSTRATES

BACKGROUND OF THE INVENTION

1. Field of the Invention

The present invention relates to a method for cleaning a surface of a semiconductor substrate such as silicon wafer.

2. Description of the Related Art

In this type of the semiconductor substrate, there are attached such as metal impurities, particles having a diameter smaller than 1 μm, and organic substances, onto the surface of the semiconductor substrate, and there are also formed working damages therein. As the degrees of integration and performance of semiconductor devices have been further increased, it has been increasingly demanded that the surfaces of semiconductor substrates are not contaminated such as by these metal impurities, particles and organic substances, and that the working damages are further decreased. Thus, the cleaning technique of the semiconductor substrate tends to have become extremely important among the semiconductor devices techniques.

As a conventional cleaning method of the semiconductor substrate, there is known an RCA cleaning method adopting an SC-1 solution including hydrogen peroxide solution and ammonium hydroxide, and an SC-2 solution including hydrogen peroxide solution and diluted hydrochloric acid. In this RCA cleaning method, the semiconductor substrate is firstly immersed in the SC-1 solution to thereby remove particles and organic substances from the substrate, by means of nature of oxidizability and alkalinity of the solution. Namely, within this SC-1 solution, there will simultaneously occur both of oxidation and reductive reactions, in which reduction by ammonia and oxidation by hydrogen peroxide occur competingly, and at the same time, particles and organic substances are desorbed from a surface of the substrate by etching effect due to ammonium hydroxide solution. Further, there are removed fine mechanical damages caused by working of the semiconductor substrate. Thereafter, the semiconductor substrate is immersed into an aqueous hydrofluoric acid solution to thereby remove a natural oxidized film, followed by immersion of the semiconductor substrate into the SC-2 solution to thereby remove alkali ion and metal impurities insoluble in the SC-1 solution.

As such, in RCA cleaning, the surface of the substrate cleaned by etching effect of ammonium hydroxide solution is re-cleaned by cleaning the substrate by the acidic solution.

Meanwhile, there have been disclosed a cleaning solution and a cleaning method of a semiconductor substrate, adapted to prevent such as; adhesion of metal impurities in a cleaning solution onto a surface of the substrate during cleaning of the semiconductor substrate; and re-adhesion of the metal impurities onto the surface of the substrate which have been once removed therefrom; to thereby restrict growth of an unnecessary natural oxidized film (Japanese Patent Application Laid-Open No. HEI-7-94458(94458/1995)). This solution comprises an acidic solution such as hydrofluoric acid, including from 0.0001 to 0.001 wt. % of ammonia or from 0.0005 to 0.01 wt. % of ethylene diamine tetraacetic acid (EDTA). This cleaning solution is to remove an oxide film, so that the pH of the solution is kept at about 1 corresponding to strong acid. According to this cleaning method, when a semiconductor substrate is immersed into the cleaning solution, there are simultaneously progressed removal of a natural oxidized film and removal of metal impurities, so that the metallic elements transferred into the cleaning solution will form complexes, i.e., metallic complex salts, and thus the metallic element are masked. The surface of the semiconductor substrate is negatively charged in the acidic solution, while the metallic complex salt forms complex ion in the acidic solution so that the surface of metallic complex salt is also negatively charged, resulting in prevention of re-adhesion of the metallic complex salt, i.e., of the metallic element, onto the substrate.

However, the aforementioned RCA cleaning method is problematic in that two actions of oxidation and reduction occur competingly in one vessel. Firstly, those metal impurities liberated from the surface of the substrate will remain in the SC-1 solution, and may re-adhere onto the surface of the substrate due to the surface potential of the impurities. Secondly, even if it is intended to form a metallic complex salt by complexing the metal ion in the SC-1 solution making use of an organic acid, the organic acid is oxidation-reduction treated and thereby decomposed in the SC-1 solution, resulting in considerable decrease of the complexing effect of the organic acid. Thus, the RCA cleaning method has such a defect that the metal impurities may not be sufficiently removed, depending on the sort of metal.

Further, in the cleaning method disclosed in the aforementioned Japanese Patent Application Laid-Open No. HEI-7-94458, the surfaces of particles are slightly positively charged in the cleaning solution of strong acid. Thus, it is problematic that the particles can be hardly removed since they heteroaggregate onto the surface of the substrate which has been positively charged from 0 (zero), even if the metal impurities can be removed from the semiconductor substrate based on the aforementioned reason.

SUMMARY OF THE INVENTION

It is therefore an object of the present invention to provide a cleaning method of a semiconductor substrate, which is adapted to satisfactorily remove, with decreased steps, fine damages caused by working of the semiconductor substrate, organic substances adhered onto the surface of the substrate, and metal impurities and particles.

According to the present invention, there is provided a cleaning method shown in FIG. 1, comprising a step 11 for oxidizing-reducing a semiconductor substrate, a step 12 for oxidizing the oxidized-reduced semiconductor substrate, a step 13 for reducing the oxidized semiconductor substrate, a step 14 for rinsing the reduced semiconductor substrate, and a step 15 for re-oxidizing the rinsed semiconductor substrate.

Further objects, advantages and details of the present invention will become more apparent from the following description of preferred embodiments when read in conjunction with the accompanying drawings.

DETAILED DESCRIPTION OF PREFERRED EMBODIMENTS

There will be described hereinafter the embodiments according the present invention, with reference to the accompanying drawings.

Figure 1:
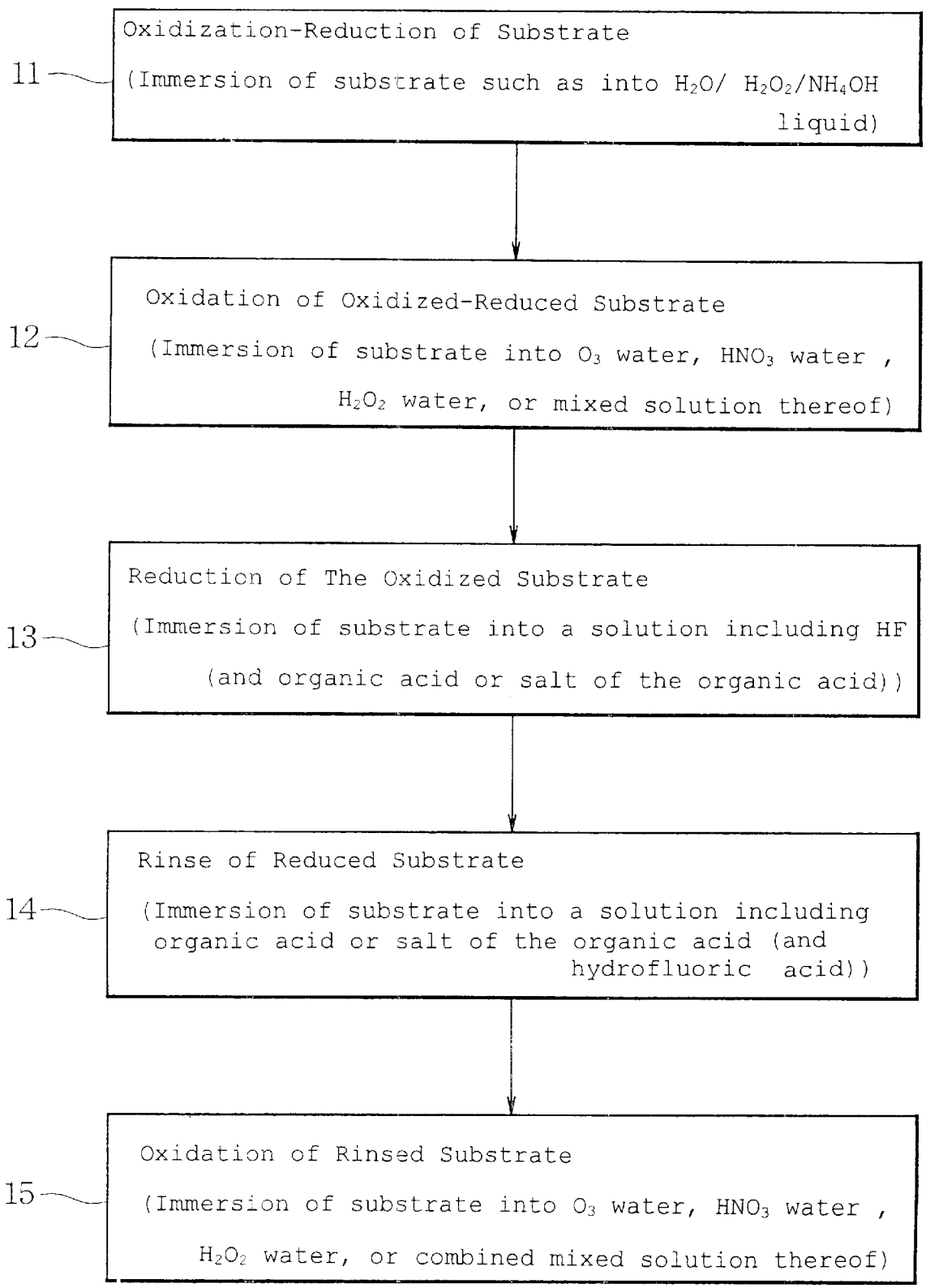
FIG. 1 is a view showing a cleaning step according to a preferred embodiment of the present invention.

As shown in FIG. 1, there is provided a cleaning method including: a step 11 for immersing a semiconductor substrate such as into a mixed aqueous solution prepared by mixing hydrogen peroxide and ammonium hydroxide; a step 12 for immersing the semiconductor substrate immersed in the mixed solution, into an oxidative solution of either of ozone dissolved aqueous solution, an aqueous nitric acid solution or an aqueous hydrogen peroxide solution, or into an oxidative solution including two or more of them; a step 13 for immersing the semiconductor substrate immersed in the oxidative solution, into a mixed aqueous solution of hydrofluoric acid with an organic acid having carboxyl groups or with salt of the organic acid; a step 14 for immersing the semiconductor substrate immersed in the mixed solution, into a solution including an organic acid having carboxyl groups or including salt of the organic acid, or into a mixed aqueous solution of hydrofluoric acid with an organic acid or salt of the organic acid; and a step 15 for immersing the semiconductor substrate immersed in the solution including the organic acid or salt of the organic acid, into an oxidative solution of either of ozone dissolved aqueous solution, an aqueous nitric acid solution or an aqueous hydrogen peroxide solution, or into an oxidative solution including two or more of them.

In the step 11, oxidization and reduction of the semiconductor substrate are continuously conducted to thereby effectively remove fine damage layers of about several nanometers at the surface of the semiconductor substrate. When the semiconductor substrate is oxidized-reduced in a mixed solution prepared by mixing hydrogen peroxide and ammonium hydroxide which particularly corresponds to the SC-1 solution to be used in the RCA cleaning method, oxidation due to ammonia and that due to hydrogen peroxide occur in a competing manner in the same vessel, and at the same time etching effect due to ammonium hydroxide solution is caused, so that particles and organic substances are removed from the surface of the substrate and the fine damages caused by working of the substrate are removed. However, re-adherence of metal impurities and particles may be caused in this solution treatment.

At step 12, the density of oxide film formed after the step 11 is further increased by a chemical oxidation effect, to thereby facilitate dissolution of this oxide film at the next step 13 such that metal impurities and particles readily leave from the surface of the substrate.

At step 13, the metal impurities and particles brought into the oxide film at step 11 and step 12 are removed from the surface of the substrate by dissolving the oxide film. Particularly when the semiconductor substrate is immersed into the mixed solution of hydrofluoric acid with an organic acid or with salt of the organic acid, hydrofluoric acid dissolves the oxide film so that the metal impurities and particles leave from the surface of the substrate, and thereafter these metal impurities immediately form a metallic complex salt with an organic acid ion. These complex ions of metallic complex salt are negative ions. Further, the surfaces of particles and the surface of the substrate, where the oxide film remains, are negatively charged due to adsorption of an organic acid ion thereto. As a result, re-adherence of metal impurities and particles onto the surface of the substrate is prevented. By changing a sort and concentration of an organic acid or a salt of the organic acid, it becomes possible to control a complexing effect of an organic acid ion for metal and a surface potential (zeta-potential) of the metallic complex salt. Namely, the ability of an organic acid ion for forming a complex is chemically determined by a complex stability constant of an organic acid ion and that of metal ion which participates in the complex. The larger these constants are, the more the formation of complex ion is promoted. By forming complex ion as described above, the charge of metal ion is changed from positive to negative.

The concentration of the hydrofluoric acid used in the step 13 is from 0.005 to 0.25 wt. %. Particularly, from 0.005 to 0.10 wt. % is preferable, and from 0.05 to 0.10 wt. % is more preferable. Below 0.005 wt. %, the removal effect for a natural oxidized film on the surface of the semiconductor substrate is poor. Beyond 0.25 wt. %, this acid becomes so strong that the dissociation of the organic acid in the solution is restricted such that its complexing effect is deteriorated, the surface potential of particles becomes about zero, and the oxide film of the surface of the substrate is completely removed. Thus, particles tend to re-adhere onto the surface of the substrate.

In step 14, there are further effectively removed those metal impurities and particles remaining on the surface of the substrate, which have not been completely removed in the step 13. These metal impurities and particles are residues at a solid-fluid interface, which are in an equilibrium state within a water film forming a molecular layer of solvent at the surface of the substrate, so that they do not adhere onto the surface of the substrate. These metal impurities form metallic complex salts with the organic acid ion, and the particles adsorb organic acid ions. As a result, those metallic complex salts and particles both negatively charged by the organic acid ion similarly to the step 13, will readily leave from the surface of the substrate. In step 14, it is possible to adopt a solution including an organic acid or a salt of the organic acid identical with the step 13, and to modify the concentration or sort of the organic acid or a salt of the organic acid. The sort and concentration of the organic acid or a salt of the organic acid in the solution to be used in step 13 and step 14 are determined depending on the sort of metal impurities to be removed. The concentration of the organic acid or a salt of the organic acid in the solution in both steps is 0.0001 wt. % or more, and preferably, from 0.003 to 10 wt. %. Below 0.0001 wt. %, it is defective because of insufficient complexing effect for metal impurity ion liberating from the surface of the substrate.

By further adding a small amount of hydrofluoric acid to the organic acid or a salt of the organic acid in the step 14, the natural oxidized film formed on the surface of the substrate is etched to a slight extent. Thus, it becomes possible that those particles or metal impurities on the natural oxidized film readily transfer into the solution including hydrofluoric acid in addition to the organic acid or a salt of the organic acid. Namely, addition of hydrofluoric acid enables removal of natural oxidized film, as well as cleaning of metal impurities within the natural oxidized film. The concentration of hydrofluoric acid in this case is 0.1 wt. % or less, and preferably, 0.001 wt. % or less. Exceeding 0.1 wt. %, the natural oxidized film at the surface of the substrate is excessively etched to thereby fluctuate the surface potential of the substrate in the solution, so that re-adherence of particles and metal may be caused.

In step 15, there is firstly enhanced a removing effect for silicide type metal, particularly Cu, which has contaminated the surface of the substrate and its vicinity; there are secondly decomposed and removed the residual components of the organic acid or a salt of the organic acid which has been used in the step 13 and step 14, or the organic substances attached to the surface of the substrate; and thirdly the surface of the substrate after cleaning is chemically protected by an oxide film. Cu is directly dissolved and removed into a slightly acidic solution having a higher oxidation potential. Further, by protecting the surface of the substrate with the chemical oxide film, adherence of particles at a solid-gas interface can be assuredly prevented.

The oxidative solution used in the step 12 or step 15 includes an ozone dissolved aqueous solution, nitric acid, or hydrogen peroxide solution. Among them, the ozone dissolved aqueous solution is preferable, since it is of high purity, abundant in oxidation ability even at a lower concentration, and easily available. The ozone concentration of this ozone dissolved aqueous solution is preferably 0.5 ppm or more. Below 0.5 ppm, it becomes difficult to form a hydrophilic oxide film at the surface of the substrate, and the decomposition and removal effect to the organic acid and organic substances adhered onto the surface of the substrate is lowered. The dissolution limit of ozone into pure water is about 25 ppm, so that the ozone concentration of the ozone dissolved aqueous solution is preferably from 2 to 25 ppm.

The organic acid or a salt of the organic acid to be used in step 13 and/or step 14 includes one or more organic acid selected from a group consisting of oxalic acid, citric acid, succinic acid, ethylenediaminetetraacetic acid, tartaric acid, salicylic acid, formic acid, maleic acid, acetic acid, proprionic acid, butyric acid, valeric acid, caproic acid, enanthic acid, caprylic acid, benzoic acid, acrylic acid, adipic acid, malonic acid, malic acid, glycolic acid, phthalic acid, terephthalic acid, and fumaric acid, or salt thereof.

The aforementioned organic acids or salt of the organic acids have a complexing effect for metal ion of impurities contaminating the substrate.

EMBODIMENTS

There will be described hereinafter embodiments according to the present invention, with a comparative example.

Embodiment 1

There was conducted a cleaning treatment for an uncleaned silicon wafer passed through a normal polishing process, under the following condition.

As the step 11, the silicon wafer was immersed in an SC-1 solution (a mixed solution of $H_2O$: $H_2O_2$ (30%): $NH_4OH$ (29%)=5:1:0.5), and treated for 10 minutes at 80° C. Next, as the step 12, this silicon wafer was immersed in an ozone dissolved aqueous solution having an ozone concentration of 5 ppm, at room temperature. Further, as the step 13, there was prepared a solution by adding 0.05 wt. % of hydrofluoric acid into a solution comprising pure water added with 0.06 wt. % of citric acid as an organic acid. Into this solution at room temperature, the silicon wafer as immersed in the aforementioned ozone dissolved aqueous solution was immersed for 5 minutes. Next, as the step 14, there was prepared a solution comprising pure water added with 0.6 wt. % of citric acid as an organic acid, and by this solution at room temperature the silicon wafer treated by the step 14 was rinsed for 5 minutes. Finally as the step 15, this rinsed silicon wafer was immersed in an ozone dissolved aqueous solution having an ozone concentration of 5 ppm at room temperature for 10 minutes.

Embodiment 2

There was cleaned a silicon wafer by repeating the method of the Embodiment 1, except that instead of the citric acid, 0.03 wt. % of oxalic acid as an organic acid was mixed into pure water at step 13, and instead of the citric acid, 0.3 wt. % of oxalic acid as an organic acid was added to pure water.

Embodiment 3

There was cleaned a silicon wafer by repeating the method of the Embodiment 1, except that instead of the citric acid, 0.001 wt. % of ethylene diamine tetraacetic acid as an organic acid was mixed into pure water at step 13, and instead of the citric acid, 0.001 wt. % of ethylene diamine tetraacetic acid as an organic acid was added to pure water.

Embodiment 4

There was cleaned a silicon wafer by repeating the method of the Embodiment 1, except that instead of the citric acid, 0.014 wt. % of formic acid as an organic acid was mixed into pure water at step 13, and instead of the citric acid, 0.14 wt. % of formic acid as an organic acid was added to pure water.

Embodiment 5

There was cleaned a silicon wafer by repeating the method of the Embodiment 1, except that instead of the citric acid, 0.035 wt. % of succinic acid as an organic acid was mixed into pure water at step 13, and instead of the citric acid, 0.35 wt. % of succinic acid as an organic acid was added to pure water.

Embodiment 6

There was cleaned a silicon wafer by repeating the method of the Embodiment 1, except that instead of the citric acid, 0.04 wt. % of salicylic acid as an organic acid was mixed into pure water at step 13, and instead of the citric acid, 0.4 wt. % of salicylic acid as an organic acid was added to pure water.

Embodiment 7

There was cleaned a silicon wafer by repeating the method of the Embodiment 1, except that instead of the citric acid, 0.035 wt. % of maleic acid as an organic acid was mixed into pure water at step 13, and instead of the citric acid, 0.35 wt. % of maleic acid as an organic acid was added to pure water.

Comparative Example

The cleaning method by the conventional SC-1 solution is adopted as that of a comparative example.

Namely, similarly to the Embodiment 1, an uncleaned silicon wafer passed through a normal polishing process, was immersed in an SC-1 solution (a mixed solution of $H_2O$: $H_2O_2$ (30%): $NH_4OH$ (29%)=5:1:0.5), and treated for 10 minutes at 80° C. Thereafter, this silicon wafer was rinsed by ultrapure water for 5 minutes.

Comparison Test and Evaluation (a): Count of Remaining Particles

There was calculated the number of particles remaining on the wafer, by counting the number of particles having a diameter larger than 0.12 $\mu$m remaining on the silicon wafer surface after cleaning of the respective embodiments 1 through 7 and the comparative example, by means of a particle counter. The result is shown in FIG. 2.

Figure 2:
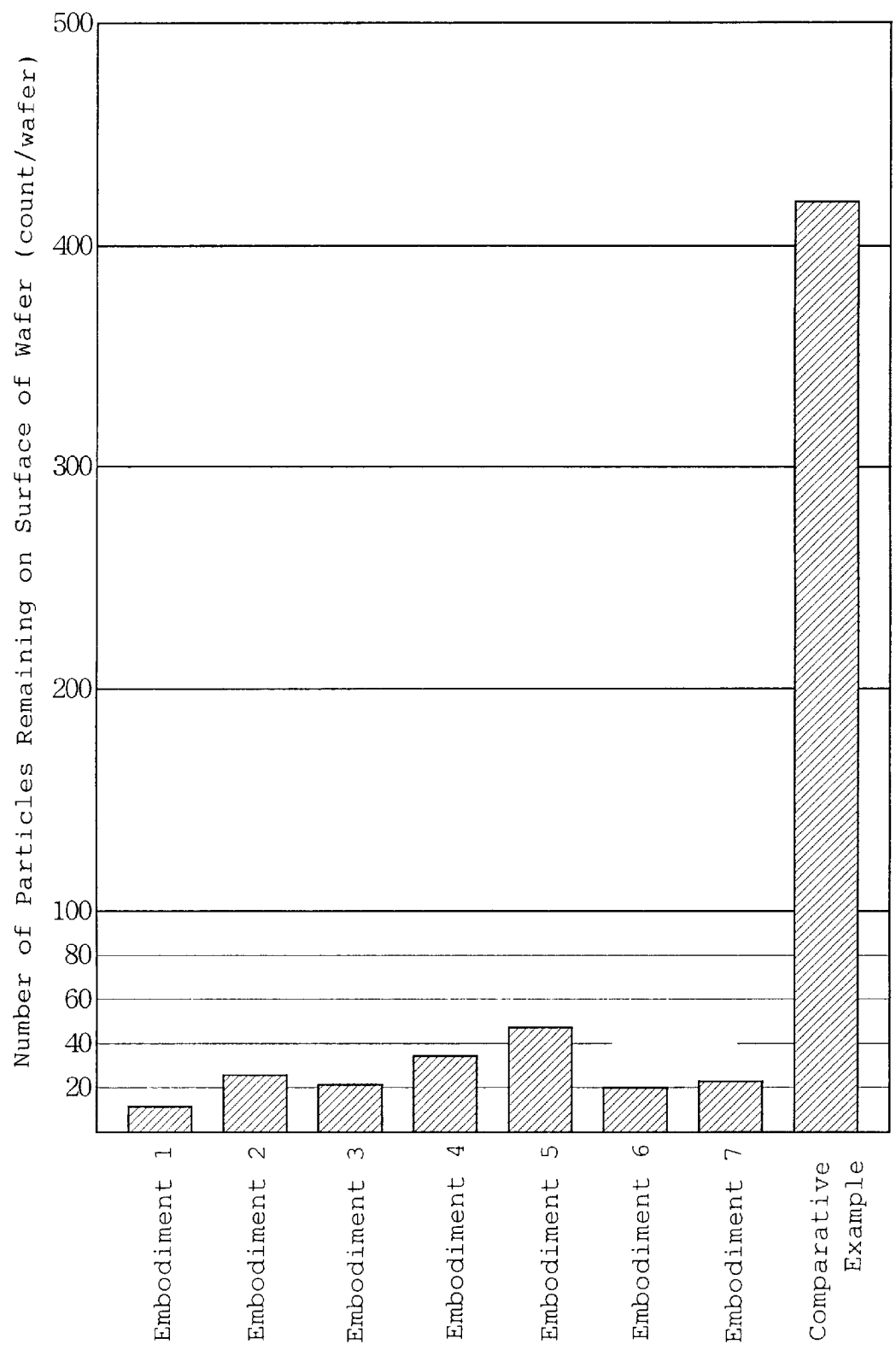
FIG. 2 is a graph showing the numbers of particles remaining on a surface of a silicon wafer, after cleaning the embodiments 1 through 7 and comparative example.

As apparent from FIG. 2, the counts of particles remaining on the wafer in the Embodiments 1, 2, 3, 4, 5, 6 and 7 were not much, i.e., 11, 26, 21, 33, 48, 20 and 22 counts, respectively. Contrary, the count of particles remaining on the wafer cleaned by the method of the comparative example was extremely much, 420 counts. As such, it has been exemplified that the cleaning method according to the Embodiments 1 through 7 is adapted to clean out particles better than the comparative example.

(b): Concentration of Metal Impurities

There were measured concentrations of five sorts of metal impurities, Al, Fe, Ni, Cu and Zn, on the silicon wafer surface after cleaning of the respective Embodiments 1 through 7 and the comparative example. These concentrations of metal impurities were measured by dropping a mixed acid of hydrofluoric acid and nitric acid, spreading the liquid drop all over the surface of the wafer, collecting the liquid drop, and analyzing the liquid drop by atomic absorption analysis. The result is shown in Table 1. In Table 1, "<1×10$^9$" means less than 1×10$^9$ which is below a detection limit.

TABLE 1

| | Concentration of Metal impurities (×10$^9$ atoms/cm$^2$) | | | | |
| --- | --- | --- | --- | --- | --- |
| | Al | Fe | Ni | Cu | Zn |
| Embodiment 1 | 9.4 | <1 | <1 | <1 | <1 |
| Embodiment 2 | <1 | <1 | <1 | <1 | <1 |
| Embodiment 3 | 5.0 | <1 | <1 | <1 | <1 |
| Embodiment 4 | 14.0 | <1 | <1 | <1 | <1 |
| Embodiment 5 | <1 | <1 | <1 | <1 | 2.9 |
| Embodiment 6 | 9.4 | 11.0 | <1 | <1 | <1 |
| Embodiment 7 | 19.0 | <1 | <1 | 6.8 | <1 |
| Comparative Example | 110.0 | 22.0 | <1 | <1 | 5.0 |

As apparent from Table 1, the wafers according to Embodiments 1 through 7 exhibit a cleaning effect superior to the comparative example concerning three sorts of metals, Al, Fe and Zn, apart from a fact that the Ni concentration and Cu concentration are similar to those of the comparative example.

Effect of the Invention

As described above, according to the cleaning method of the present invention, the semiconductor substrate is submitted to a chemical reaction, in the order of oxidization-reduction, oxidation, reduction, rinsing, and oxidation, to thereby enable removal of fine damages caused by working of the semiconductor substrate, and organic substances, metal impurities and particles adhered onto the surface of the semiconductor substrate, with a decreased number of steps.

Although what has been described is at present considered to be the preferred embodiments of the present invention, it will be understood that the present invention may be embodied in other specific forms without departing from the spirit or essential characteristics thereof. The present embodiments are therefore to be considered in all respects as illustrative and not restrictive. The scope of the invention is indicated by the appended claims rather than by the foregoing description.

What is claimed is:

1. A method for treating a semiconductor substrate comprising:

(a) oxidizing and reducing the semiconductor substrate by immersing the semiconductor substrate in an aqueous solution of NH$_4$OH and H$_2$O$_2$;

(b) oxidizing the semiconductor substrate from step a) by immersing the semiconductor substrate in an aqueous solution of a compound selected from the group consisting of ozone, nitric acid, hydrogen peroxide, and mixtures thereof;

(c) reducing the oxidized semiconductor substrate from step b) by immersing the semiconductor substrate in a first aqueous solution of a mixture of hydrofluoric acid and a compound selected from the group consisting of an organic acid containing a carboxyl group and a salt of the organic acid;

(d) rinsing the reduced semiconductor substrate from step c) by immersing the semiconductor substrate in a second aqueous solution of a mixture of hydrofluoric acid and a compound selected from the group consisting of an organic acid containing a carboxyl group and a salt of the organic acid; and (e) reoxidizing the rinsed semiconductor substrate from step d) by immersing the semiconductor substrate in an aqueous solution of a compound selected from the group consisting of ozone, nitric acid, hydrogen peroxide, and mixtures thereof.

2. The treatment method of claim 1 wherein the concentration of hydrofluoric acid in step c) is from 0.005 to 0.25 weight percent.

3. The treatment method of claim 1 wherein the concentration of the organic acid or the salt of the organic acid in steps c) and d) is 0.0001 weight percent or more.

4. The treatment method of claim 1 wherein the organic acid or salt of the organic acid is selected from the group consisting of oxalic acid, citric acid, succinic acid, ethylenediaminetetraacetic acid, tartaric acid, salicylic acid, formic acid, maleic acid, acetic acid, proprionic acid, butyric acid, valeric acid, caproic acid, enanthic acid, caprylic acid, benzoic acid, acrylic acid, adipic acid, malonic acid, malic acid, glycolic acid, phthalic acid, terephthalic acid, fumaric acid and salts of said acids.

5. The treatment method of claim 2 wherein the concentration of hydrofluoric acid in step d) is from 0.01 weight percent or less.

* * * * *